United States Patent
Sacher et al.

(10) Patent No.: US 7,501,822 B2
(45) Date of Patent: Mar. 10, 2009

(54) COOLED NMR PROBE HEAD WITH FLEXIBLE COOLED CONNECTING CONDUIT

(75) Inventors: Marco Sacher, Uster (CH); Daniel Marek, Moeriken (CH); Tobias Leutenegger, Zurich (CH); Daniel Guy Baumann, Russikon (CH); Ralf Haueisen, Karlsruhe (DE)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/730,765

(22) Filed: Apr. 4, 2007

(65) Prior Publication Data
US 2007/0257676 A1  Nov. 8, 2007

(30) Foreign Application Priority Data
May 3, 2006  (DE) .................. 10 2006 020 772

(51) Int. Cl.
*G01V 3/00* (2006.01)
(52) U.S. Cl. ........................ 324/318; 324/319
(58) Field of Classification Search ................. 324/318, 324/319, 320
See application file for complete search history.

(56) References Cited

U.S. PATENT DOCUMENTS

| 5,508,613 | A | 4/1996 | Kotsubo |
| 5,829,791 | A | 11/1998 | Kotsubo |
| 5,889,456 | A | 3/1999 | Triebe |
| 5,913,888 | A | 6/1999 | Steinmeyer |
| 6,677,751 | B1 | 1/2004 | Marek |
| 6,771,072 | B2 * | 8/2004 | Schuster et al. ............. 324/318 |
| 6,774,631 | B2 * | 8/2004 | Heid ........................... 324/318 |
| 2006/0038567 | A1 | 2/2006 | Morita |

FOREIGN PATENT DOCUMENTS

| EP | 1 471 363 | 10/2004 |
| WO | WO 03/050554 | 6/2003 |

OTHER PUBLICATIONS

R. Haueisen et al., Cryogenic probe setup for routine MR imaging on small animals at 9.4 T. ESMRMB, Basel Sep. 16, 2005.

* cited by examiner

*Primary Examiner*—Louis M Arana
(74) *Attorney, Agent, or Firm*—Paul Vincent

(57) ABSTRACT

A magnetic resonance (MR) probe head comprises a detecting device with at least one antenna system which is cryogenically cooled by a cooling device, and a cooled preamplifier in a preamplifier housing which is spatially separated from the detecting device, and a thermally insulating connecting means via which the detecting device and the preamplifier housing are connected, wherein the connecting means comprises at least one cooling line for supplying and/or returning a cooling fluid, and with at least one RF line for transmitting the electric signals. The connecting means is implemented as a mechanically flexible connecting line with mechanically flexible RF lines and cooling lines disposed therein. The MR probe head is easy to handle and can be highly sensitive, wherein the detecting device can be quickly installed, removed and put into operation.

24 Claims, 9 Drawing Sheets

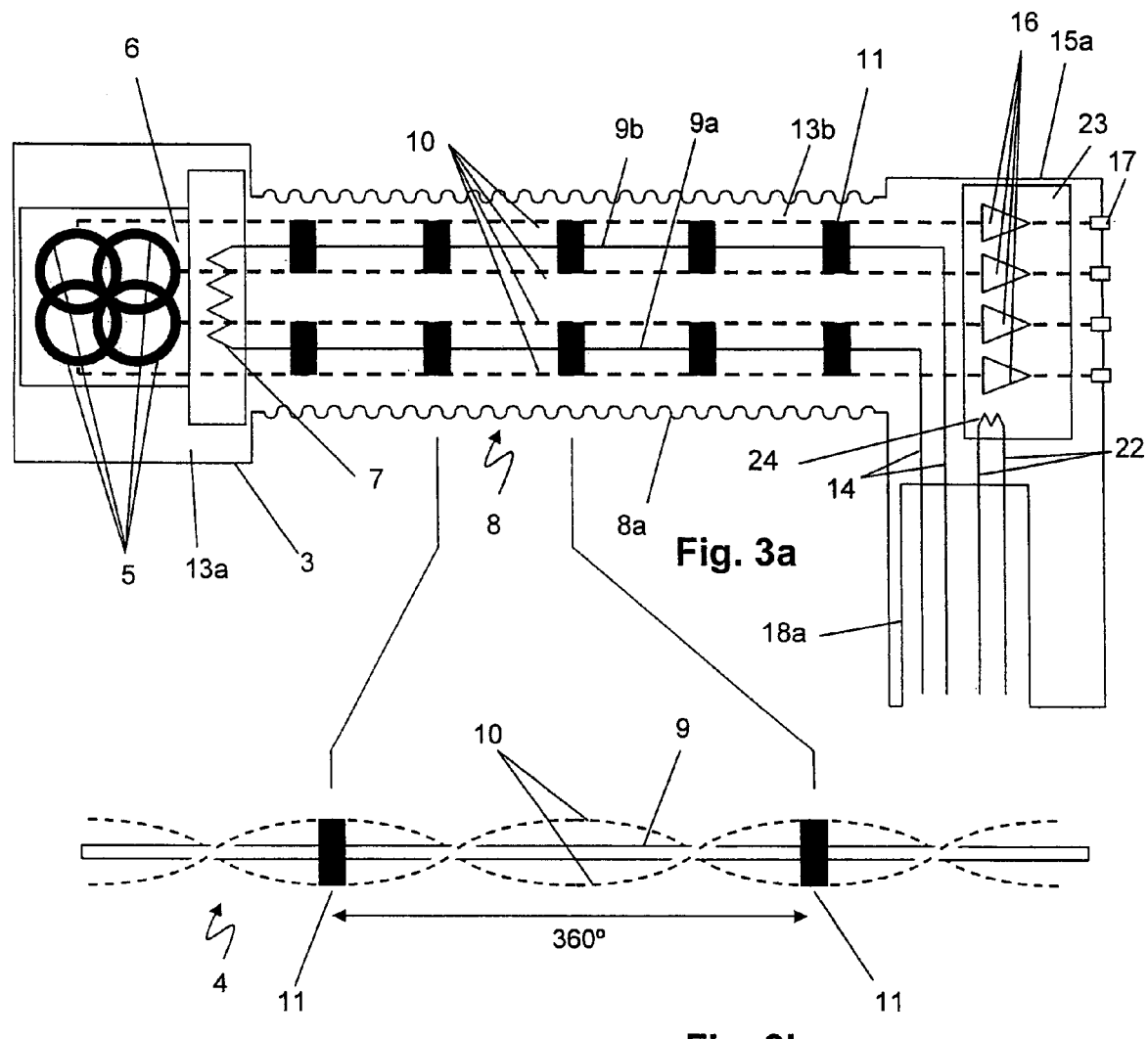

COOLED NMR PROBE HEAD WITH FLEXIBLE COOLED CONNECTING CONDUIT

This application claims Paris Convention priority of DE 10 2006 020 772.6 filed May 3, 2006 the complete disclosure of which is hereby incorporated by reference.

BACKGROUND OF THE INVENTION

The invention concerns a magnetic resonance (MR) probe head with a detecting device, comprising at least one antenna system which is cryogenically cooled by a cooling device, and a cooled preamplifier in a preamplifier housing which is disposed at a spatial separation from the detecting device, and with a thermally insulating means which connects the detecting device to the preamplifier housing, wherein the connecting means comprise at least one cooling line for supplying and/or returning a cooling fluid, and at least one radio frequency (RF) line for transmitting the electrical signals.

A probe head of this type is disclosed e.g. in reference [3] (see e.g. FIG. 5 thereof) and is used for detecting NMR signals from a sample. The receiver coil is thereby cooled. This receiver coil may e.g. be a coil made from a normally conducting metal, e.g. copper or aluminium, or from superconducting materials, in particular, high-temperature superconductors (HTSC).

The conventional cooled systems for NMR detection can be classified into the following categories:

a) systems which are directly cooled by LN2. LN2 is thereby inserted into a container and measurements are performed until the coolant is consumed (evaporated). Such an arrangement is mentioned e.g. in reference [1] and is schematically shown in FIG. 5.

b) systems which are cooled by a cold head in the direct vicinity of the receiver coil, generally using a so-called pulse tube cold head, which is compatible with the requirements for the magnetic field and vibration. A configuration of this type is disclosed in reference [2] and schematically shown in FIG. 6.

c) systems which are cooled by a cold head, wherein the cold head is located at a certain distance from the probe head itself. This cold head is typically a Gifford-McMahon cooler, but may also be a pulse tube cooler. The probe head is generally cooled with a flexible transfer line to bridge the separation from the cryocooler and to also keep vibrations away from the probe head. A heat transporting medium circulates in this transfer line (usually cold, gaseous helium). The probe head itself typically contains the receiver coils and the preamplifier, which are connected to each other via RF lines. The probe head is thereby designed as a rigid unit. Such a configuration is disclosed in reference [3] and represented in FIG. 7b (horizontal magnet) or in FIG. 7a (vertical magnet).

It must be noted that this concerns only reception of the NMR signals. This is also the process which must be controlled with maximum precision to obtain a maximum S/N ratio, and depends to a critical degree on attenuation, temperatures and noise of the elements involved.

The nuclei must be excited prior to measurement by at least one RF pulse. This can be realized either by the receiver coil itself or through a separate transmitter coil. The transmitter coil may either also be cooled or be at room temperature. Further systems and devices for generating the nuclear excitation are not discussed herein for reasons of simplicity.

The above-mentioned conventional MR probe heads are discussed below:

a) the configurations in accordance with a) (FIG. 5) have a relatively simple construction but are disadvantageous in that liquid nitrogen 60 must be refilled into a thermally insulated housing 61 and the temperature of the receiver coil 5 is only reduced to 77 K. It is thereby important that the preamplifier 58 and also the RF line 59 (usually in the form of a coaxial cable) between the receiver coil 5 and the preamplifier 58 are also normally at room temperature. In consequence thereof, the preamplifier 58 produces an unnecessary amount of noise and the RF line 59 additionally impairs the S/N ratio, for the following reasons: Firstly, the NMR signal itself is weakened by attenuation in the RF line 59. Secondly, the RF line 59 itself generates an undesired noise signal due to its dissipation. This is higher, the higher the RF line 59 attenuation and the higher its physical temperature. These disadvantageous effects are multiplicative. An RF line 59 at room temperature has the following disadvantages: its signal losses are high, and its physical temperature is also high, thereby providing two counts for of high noise emission. For this reason, the above-mentioned effects will be substantial.

b) The configuration of b) (FIG. 6) is a potentially better solution in view of cooling. The system may thereby be very compact, wherein cooling takes place in the vicinity of the receiver coil 5 to facilitate obtaining a low temperature. The system is also a closed system which requires only electric energy for driving the compressor 56 required for operation of a pulse tube cold head 54 in a thermally insulated housing 55 and is connected to the pulse tube cold head 54 via a flexible pressure line 57. In particular, no cryogenic liquids must be refilled.

The configuration has one serious drawback: the preamplifier 58 must either be operated at room temperature and/or outside of the magnet 1. In the first case, its noise temperature is not optimum, but excessively high. In the latter case, the preamplifier 58 could also be cooled. There are no conventional preamplifiers with satisfactory function which perform perfectly at cold temperatures (<<77K) in the magnetic fields (>>1T) used for NMR, in particular, high field NMR.

When the preamplifier 58 is outside of the magnet 1, it is conventionally connected to a receiver coil 5 via a correspondingly long RF line 59. This RF line 59 is at room temperature, and therefore has the disadvantages mentioned under b) above, leading to deterioration of the S/N ratio.

There is another problem. In order to cool the preamplifier 58, it must either be cooled by LN2, which is not very user-friendly and opposes the original idea of a closed system, or a second pulse tube cold head is used only for the preamplifier 58. This is very expensive. In any case, the problem of the non-cooled RF line 59 remains.

c) the configuration in accordance with c) (FIG. 7a, FIG. 7b) is technically the best of the conventional configurations and potentially offers the highest performance, since the RF receiver coil 5 is operated in the room temperature bore 2 of the magnet 1 at a very low temperature (e.g. 20K) and the preamplifier 16 is operated at a such a low temperature to assume proper function (e.g. 77K). Also the RF line 52 between the receiver coil 5 and the preamplifier 16 is at a very low temperature. The temperature typically changes along the RF line 52 from 20 K to 77 K, wherein the geometry (in particular the cross-section of the cables of the RF line 52) is selected to obtain an optimum between minimizing the RF line losses and minimizing the heat input into the cold receiver coil 5 produced by the heat conductivity of the RF line 52. Thus, the S/N ratio of the system is nearly optimum. After amplification with the cooled preamplifier 16, the signal is finally output to a signal output 17 at the output of the preamplifier 16 for further signal processing. The overall cooling can be performed with one single cryocooler 20 (Gifford-McMahon or pulse tube cold head).

This configuration has been prior art for some time for high-resolution probe heads of NMR spectroscopy (FIG. 7a) [3]. Prototypes for MRI imaging have also been built according to this principle (FIG. 7b) [4]. This configuration has the serious drawback that the entire probe head is long, which produces the following problems:

1. Installation may become impossible under unfavorable spatial conditions. These problems are shown in FIG. 8. The separation D1 between the magnet 1 and the wall 62 must be sufficient to permit installation and removal of the system into and from the magnet. This minimum distance is substantially determined by the sum of the lengths of the actual detecting device 3, the preamplifier housing 15a, and the rigid connecting means 15c.
2. The entire probe head including typically large preamplifier 16 and associated housing 15a is quite heavy, such that installation/removal typically requires two persons.
3. Due to the large weight and bulkiness of probe head and connected cooling line, installation or removal of such a probe head in the cold state is very difficult and not practicable. The transfer line 19 (FIGS. 7a, 7b) which extends between the cryocooler 20 and the probe head, typically contains four cooled pressure lines (continuing cooling lines 21a-21d) and is quite heavy and inflexible. Installation/removal in the cold state is desired and would permit cooling the probe head outside of the room temperature bore of the magnet prior to use, and insertion of it into the room temperature bore only directly before the measurement. After the measurement, the probe head could be removed in the cold state and be left cold until subsequent use or allowed to heat up outside. This is not practicable for the above-mentioned reasons, and for this reason, the probe head must be typically inserted into the room temperature bore 2 in a warm state (i.e. at room temperature), and then connected to the transfer line 19 and the cryocooler 20. Only then can the cooling process start, which typically takes at least four hours. During this time, the magnet 1 is blocked and unproductive. Removal is effected under similar conditions. The warm-up phase typically takes at least two hours. These times cannot be tolerated in view of the required utilization rate of an MRI system.

Prior art provides either relatively compact, cooled systems without optimum performance or high-performance systems with optimum little noise. These may, however, be fundamentally unsuitable for installation into narrow spaces, or be very difficult to handle.

It is therefore the underlying purpose of the present invention to propose an MR probe head which is easy to handle, is highly sensitive, and permits rapid installation, removal and rapid start of operation of the detecting device.

SUMMARY OF THE INVENTION

This object is achieved in accordance with the invention in that the connecting means is designed as a mechanically flexible connecting line with mechanically flexible RF and cooling lines.

The detecting device of the inventive MR probe head is both small and lightweight, since the detecting device is cooled by an external cooling device and therefore contains no cold head or coolant supply container. The space required for installation and removal of the MR probe head is minimized by the flexible design of the connecting means and the RF and cooling lines. The detecting device, which forms part of the probe head, which is operated in the direct vicinity of the object to be investigated, and which receives the RF signals, can thereby be quickly installed into the magnet and put into operation. After termination of the measurements, the detecting device can be quickly and simply shut-down and removed from the room temperature bore of the magnet.

The inventive MR probe head is advantageously a probe head for magnetic resonance imaging (MRI) applications or for NMR (nuclear magnetic resonance) spectroscopy. In particular, in MRI applications, rapid handling is particularly advantageous, since the investigation methods and therefore the detecting device must be frequently changed. The inventive MR probe head can reduce unproductive standstill times of the very expensive magnet system.

With particular advantage, the inventive MR probe head has two cooling lines which are part of a first cooling circuit, instead of cooling the MR probe head with one single cooling line, wherein the coolant evaporates on the components to be cooled. In this case, the coolant can be recooled or also optionally reliquified and reused.

In a particularly preferred embodiment of the invention, one or several RF lines are associated with each single cooling line, where they each form, together with the associated cooling line, one line package.

The lines within one line package are tightly arranged, such that temperature is balanced between the individual lines within the line package.

In a further development of this embodiment, the cooling line and the RF lines, associated with the cooling line, of one single line package, are thermally coupled to each other, preferably in regular separations, via coupling elements having good thermal conducting properties. These coupling elements may be produced e.g. from copper.

In a further development, at least one of the line packages contains at least one elastic reinforcing element, in particular, a wire having high mechanical integrity to reduce the mechanical tensile and bending strain of the RF and cooling lines. The reinforcing element may e.g. be made from stainless steel.

In a preferred embodiment, the individual line packages are twisted, preferably at least once, about the axis of the connecting line along the entire length of the connecting line.

With particular advantage, the RF lines and/or the elastic reinforcing elements within the packages are twisted with the cooling line between two coupling elements through substantially 360 degrees or an integer multiple thereof, in particular, wound about the cooling line. The overall length of all lines between the coupling elements thereby remains substantially the same when they are bent. Therefore, the lines do not bulge or bend when the connecting line is bent. The cooling line may also be twisted about the RF lines and/or the elastic reinforcing elements, or both together. The cooling line may also be previously twisted about the RF line.

The RF line of the inventive MR probe head advantageously comprises a flexible coaxial cable preferably with polytetrafluoroethylene (PTFE) insulation, wherein the outer conductor consists of a combination of a metal braiding and a spirally wound metal foil having good electric conducting properties.

With particular advantage, the cold parts of the connecting line, in particular, the cooling lines and the RF lines, are disposed in a vacuum within at least one flexible outer jacket for thermal insulation. In this fashion, the heat input into the cold parts of the MR probe head is minimized, in particular, through super insulation. The connecting line may also comprise two parallel hose lines as an outer jacket, wherein one hose line houses the feed line and the other the return line, each comprising a number of associated RF lines. This configuration is advantageous in that each of the two hose lines may have a smaller diameter and thereby be more flexible. However, an embodiment with one single outer jacket is advantageous, since its thermal insulation is improved due to a smaller overall surface for a given cross-section and constitutes a simpler, more robust and neater configuration (seen from the outside) while also exhibiting an isotropic bending behavior.

The electronics of the cooled preamplifier are advantageously cooled by a second cooling circuit, which is separate from the at least one cooling line.

In a particularly preferred embodiment, the first and the second cooling circuits are cooled by the same cooling device, such that the costs and also the space for a further cooling device are obviated.

Helium is preferably provided as a cooling fluid for cooling the components of the MR probe head.

The cooling device may advantageously be a Gifford-McMahon cooler.

The cooling device may alternatively be a pulse tube cooler.

The antenna system is advantageously operated at a lower temperature than the preamplifier.

In a further development of this embodiment, the antenna system is operated at a temperature in the range of 4 to 40 K and the preamplifier is operated at a temperature in the range of 40 to 100 K.

In a particularly preferred embodiment of the inventive MR probe head, the separation between the preamplifier and the last coupling element on the side of the preamplifier is larger than the average separation between two coupling elements. There is no thermal contact between the RF line and the cooling line along the path between the preamplifier and the last coupling element on the preamplifier side, such that the temperature of the RF lines corresponds substantially to the temperature of the cooling lines or the temperature $T_c$ of the receiver coils, and the temperature transition to the preamplifier temperature $T_p$ takes place only shortly before the preamplifier. While a sufficiently dense (tightly arranged) configuration of coupling elements cools the RF line in a large area along the RF line, this coupling is no longer provided on the above-described path for the temperature transition to the preamplifier, such that the temperature can rise steadily.

With respect to handling, the mass of the parts of the detecting device is advantageously less than 5 kg.

In a particularly preferred embodiment of the inventive MR probe head, the preamplifier comprises several parallel preamplifier channels.

It may thereby be advantageous for the preamplifier to comprise several, in particular 2, 3, 4, 6, 8, 12 or 16 parallel channels for the same nucleus to be examined, in particular, 1H.

In a further embodiment of the invention, the preamplifier comprises channels for amplifying the signals of the nuclei 31P, 13C, 23Na, 19F, 17O, 129Xe or 2H.

The invention also concerns an MR system comprising the above-described inventive probe head.

The invention can be utilized with particular advantage when the MR system is an MRI or an NMR system.

The connecting line of the inventive MR probe head including its inner components may be sufficiently flexible that the space required in the extension of the room temperature bore for installation and removal of the detecting device is less than the separation between the magnet center and the end of the magnet. Moreover, the inventive MR probe head also permits installation and removal of the detecting device in the cold state, in particular, due to the inventive design of the connecting line. In this fashion, MR systems can be realized with maximum efficiency, in particular, in view of the signal/noise (S/N) ratio and simple handling.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

BRIEF DESCRIPTION OF THE DRAWING

FIG. 3a shows a detailed view of an inventive MR probe head;

FIG. 3b shows a detailed view of a line package of an inventive MR probe head with coupling elements;

DESCRIPTION OF THE PREFERRED EMBODIMENT

Figure 1:
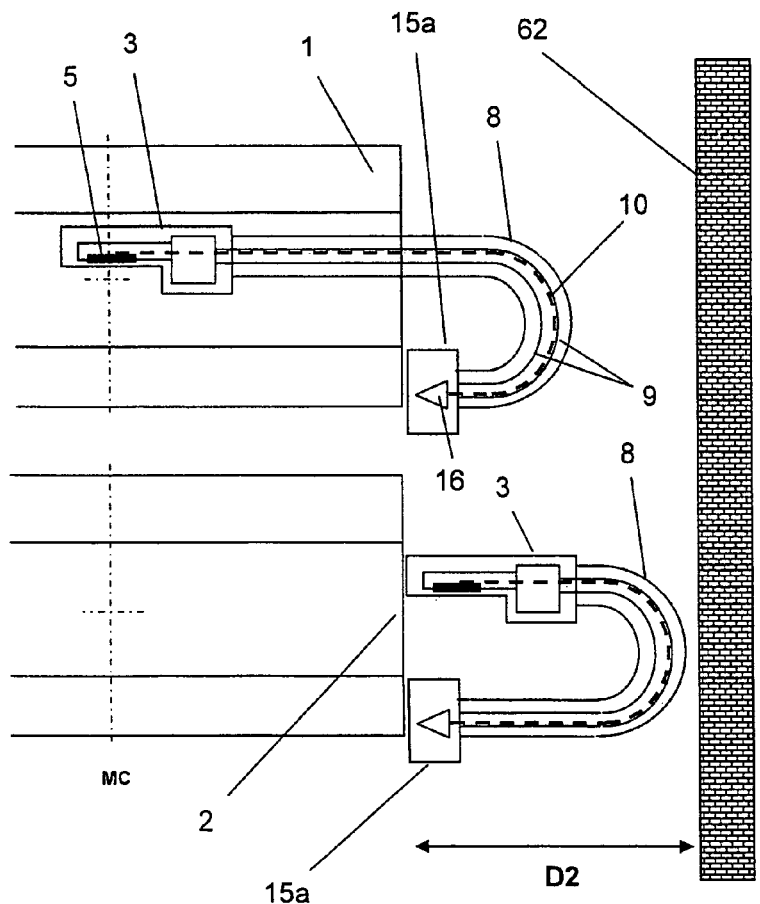
FIG. 1 shows an inventive MR probe head in the operating position and during installation/removal into/from the magnet.

The inventive probe head for receiving NMR signals is schematically shown in FIG. 1 and comprises the following components:

a) a detecting device 3 with at least one cryogenically cooled antenna system. The antenna system of the inventive MR probe head comprises at least one antenna, wherein such an antenna may consist of at least one receiver coil 5, or a resonator, or another type of RF oscillating circuit which is sensitive to electromagnetic fields. The detecting devices of the present type are mainly MRI systems for the examination, in particular, imaging of objects, and in particular of living beings. The inventive device may also be used for systems for NMR spectroscopy or also for combined methods such as e.g. localized spectroscopy.

b) a cooled preamplifier 16 in a preamplifier housing 15a which is spatially separated from the NMR detecting device 3.

c) a flexible connecting line 8 which is thermally insulated from the surroundings for connecting the NMR detecting device 3 to the preamplifier housing 15a, wherein the flexible connecting line 8 has cooling lines 9 (see FIGS. 3a, 3b) for supplying or returning a cooling fluid, and also RF lines 10 for transmitting the electric signals.

Due to the flexibility of the connecting line 8, the free separation D2 required from the outside, e.g. between a wall 62 and the outlet of the room temperature bore 2 of the magnet 1, which must be present to insert and remove the NMR detecting device into and from the room temperature bore of the NMR magnet, has a minimum size.

The resulting advantage can be noticed especially in horizontal MRI magnets which are disposed e.g. close to the wall 62 for reasons of space.

FIG. 1 shows the inventive MR probe head in a horizontal magnet, wherein both the receiver coil 5 and the preamplifier 16 are cooled to a minimum possible temperature, with their RF line 10 also being kept at a very low temperature. The system solves the object of the invention through the flexible design of the connecting line 8 with a cooled flexible RF line 10 between the receiver coil 5 and the preamplifier 16. This permits very good handling, thereby keeping all performance advantages, since the detecting device 3, i.e. the end of the probe head that contains the receiver coil(s) 5 is small, lightweight, and can be easily handled due to the inventive highly flexible connecting line 8. (The compact size and small weight can be realized, since in contrast to prior art in accordance with a) or b), the detecting device 3 need not contain a cold head nor a coolant supply container). In particular, in a corresponding design of the system which is explained in more detail below, the system can be inserted and removed into and from the magnet 1 in the cold state at any time. This eliminates all disadvantages of variant c) and the advantages of this variant remain practically unchanged. The inventive device therefore combines all advantages of the existing systems, but eliminates their disadvantages.

Figure 2:
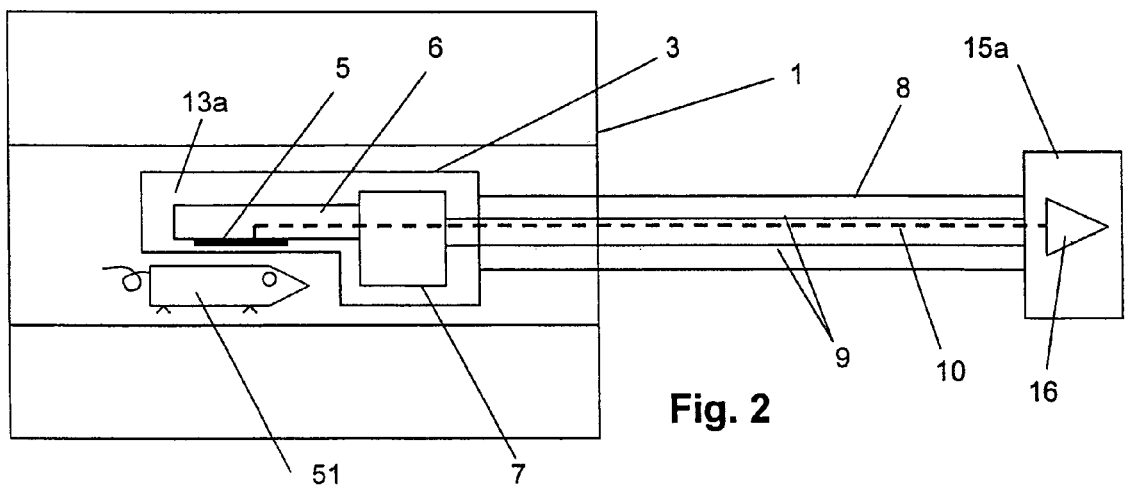
FIG. 2 shows a schematic view of an inventive MR probe head.

The realization of the inventive configuration has not been considered up to now due to the extensive technical requirements. It is schematically shown in FIG. 2 and in detail in FIG. 3a. Both figures show the probe head in the stretched position. This meets the following technical requirements for both the system and the connecting line 8 at the same time:

1. The connecting line 8 has a flexible outer jacket, in which the cooling and RF lines extend and are insulated from the surroundings by a vacuum which is contracted preferentially minimally during evacuation.
2. The cooling line 9 (at least two cooling lines 9a, 9b are required for a first cooling circuit 14) for cooling the coil are flexible. They must withstand a pressure on the order of magnitude of 20 to 30 bars while thereby remaining flexible. In one preferred embodiment, they can also be bent in the cold state.
The desired bending radius is on the order of 30 cm, which is very small. The cooling lines 9, 9a, 9b must be sufficiently resistant to fatigue caused by repeated handling, and thereby withstand sufficient bending cycles.
3. The RF lines 10 (at least one, preferably four or more) are flexible, preferably also in the cold state, and have little RF loss. Even after many cycles, they must not show any fatigue ruptures and only minimum signal crosstalk. In order to minimize the RF loss and noise, it must be possible to operate the RF lines 10 at a minimum possible temperature.
4. The connecting line 8 and the antenna system have excellent thermal insulation.

FIG. 2 shows the schematic view of the magnet 1 with a test object 51 and the installed detecting device 3 of the probe head, which contains a vacuum 13a. The flexible connecting line 8 is thereby shown in a stretched state. On the left-hand side, the detecting device 3 is shown and has a vacuum-tight housing which is insulated from the vacuum 13a in the detecting device 3. It contains the antenna system in the form of four receiver coils 5 and a heat exchanger 7 and a heat-conducting connection 6 between the heat exchanger 7 and the receiver coils 5 for cooling the receiver coils 5. In principle, several heat exchangers 7 may also be provided. The flexible connecting line 8 is shown in the center. The preamplifier housing 15a is shown on the right, including the cooled preamplifier 16 (without further details). The flexible RF line 10 is shown by a dashed line, like in all other figures.

FIG. 3a shows the system in more detail. The connecting line 8 comprises the vacuum-tight outer jacket, in the present case in the form of a corrugated bellows 8a, two cooling lines 9a and 9b, and RF lines 10 and is also shown in a stretched state. The receiver coils 5 form an array of four coils and are cooled by the heat exchanger 7. The cooling lines 9a, 9b connected to the heat exchanger 7 are guided through the connecting line 8 into the preamplifier housing 15a. Although the cooling lines 9a, 9b are tubes or thin corrugated bellows, they are only represented as a line in this illustration and also in the other figures. They extend into a coupling part 18a of a coupling on the preamplifier side, which can connect the preamplifier housing 15a to a cryocooler 20 (not shown in FIG. 3a). Such a coupling is disclosed e.g. in [5] and [3]. The cold lines 9a, 9b, 10 within the connecting line 8 are thermally insulated by a vacuum insulation 13b as well as optional additional super insulation (not shown).

Figure 7A:
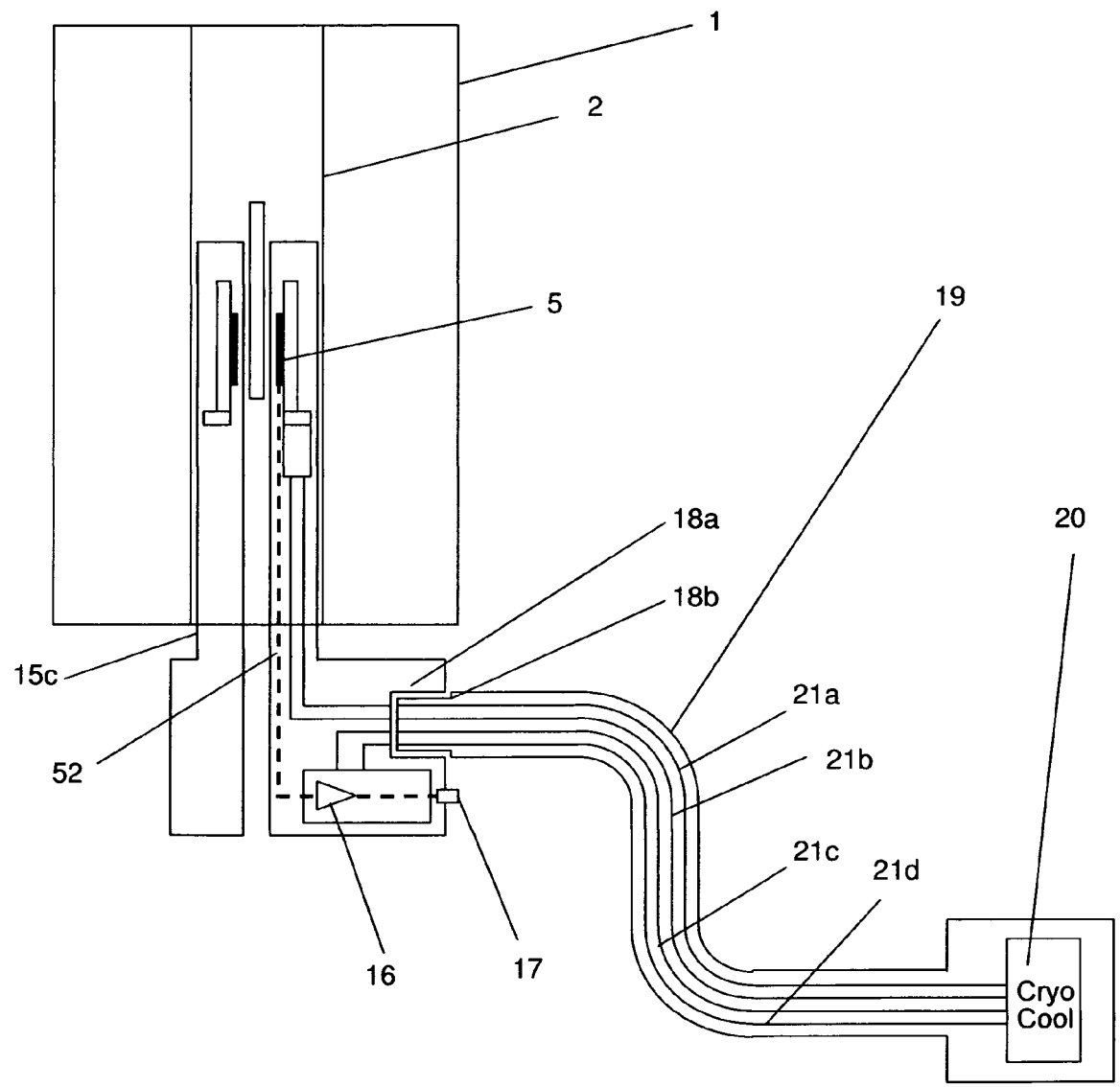
FIG. 7a shows an NMR probe head with a rigid connecting means in accordance with prior art in a vertical magnet for high-resolution NMR spectroscopy.
Figure 7B:
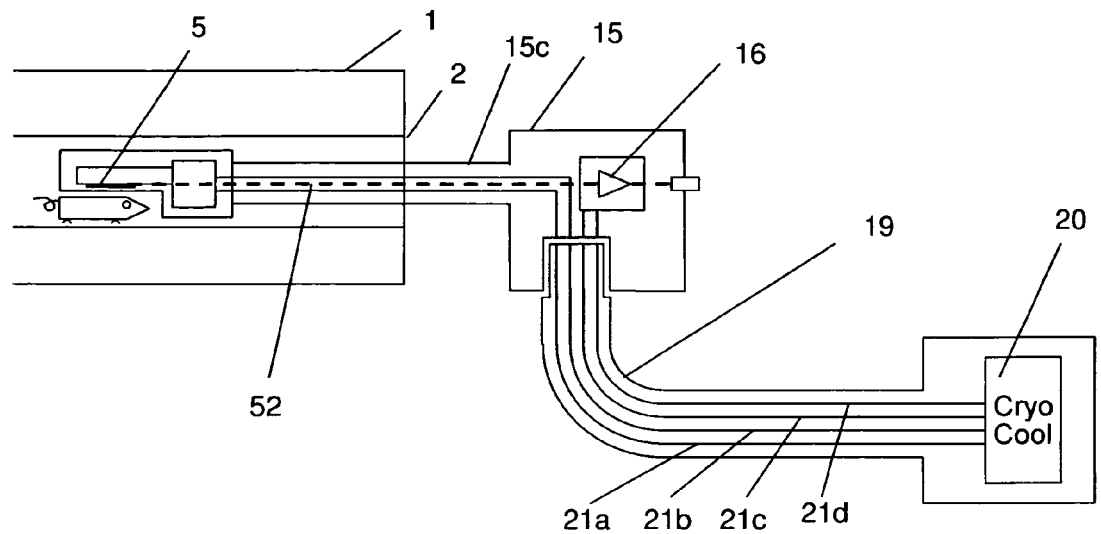
FIG. 7b shows an MRI probe head with a rigid connecting means in accordance with prior art in a horizontal magnet for MRI applications.
Figure 8:
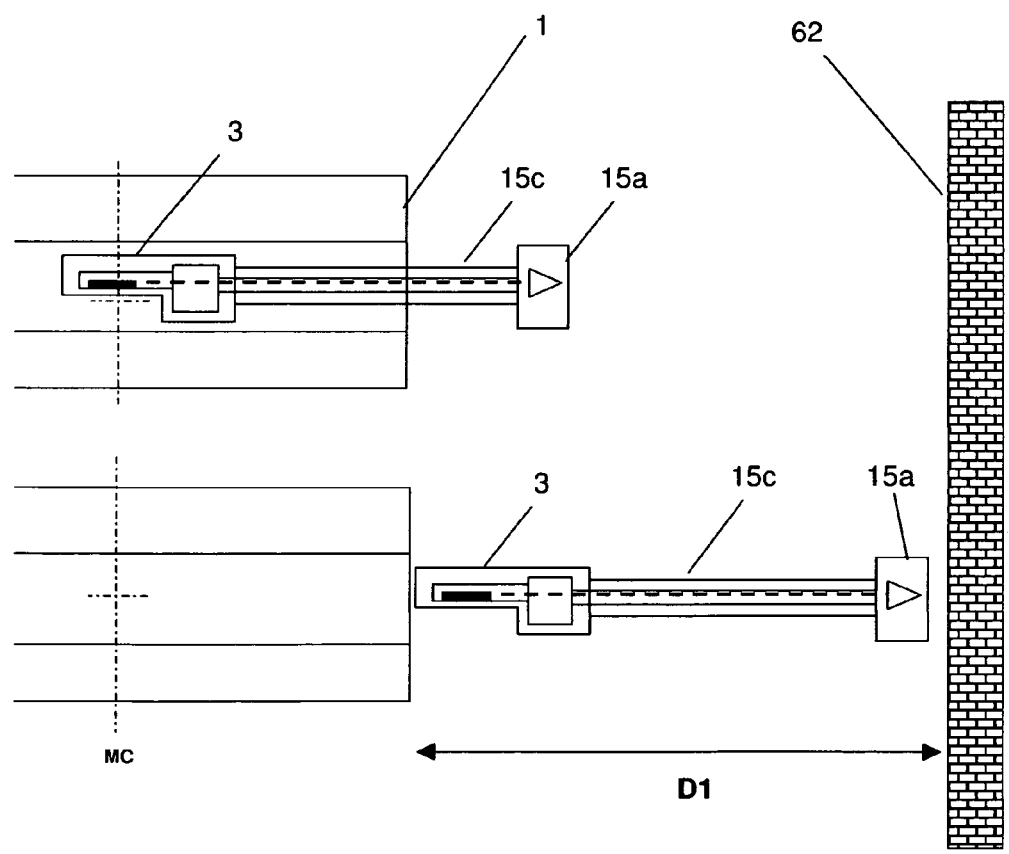
FIG. 8 shows an MR probe head corresponding to FIG. 7b in the operating position and during installation/removal into/from the magnet.

Each of the four receiver coils 5 shown in FIG. 3a is connected to one of the cooled preamplifiers 16 via one of the inventive flexible RF lines 10. In this embodiment, the four preamplifiers 16 may be connected to a thermal stage (heat sink) 23 within a second cooling circuit 22 with continuing cooling lines 21c, 21d of a coupling part 18b on the cryocooler side which is shown e.g. in FIG. 7a and described in reference [6].

The temperature of the receiver coil 5 is e.g. 20K, the temperature of the preamplifier 16 is e.g. 77K. A particularly preferred embodiment of the inventive connecting line 8 has the following structure which is described in more detail below:

the outer jacket consists of a corrugated bellows 8a, which is preferably reinforced by a wire braiding. This ensures good flexibility, wherein, however, the contraction through evacuation is kept at an acceptable level.

cooling: The RF lines 10 are not directly guided from the receiver coils 5 to the preamplifier 16, but are actively cooled along the path under well-defined conditions, which are explained in more detail below. This cooling is performed by at least one of the present cooling lines 9 that extend to the receiver coil 5. Each cooling line 9a and/or 9b may thereby be associated with a number of flexible RF lines 10. It is thereby not important which cooling line 9a, 9b is used. The feed (cooling line 9a) has a slightly lower temperature than the return (cooling line 9b). In the simplest case, only one flexible RF line 10 is e.g. connected to the feed line 9a. In a more complex case, the four RF lines 10 may e.g. be cooled with the feed 9a, and also four by the return 9b. This produces eight parallel, cooled RF lines.

The lines 9a, 9b, 10 are thermally coupled to each other by coupling elements 11. Such a coupling element 11 typically consists of a Cu cylinder to which the cooling line 9a or 9b, the outer conductor 10b and/or the inner outer jacket 10c (FIG. 4b) of the flexible RF line 10 and optionally further elements are mechanically or thermally connected, preferably through soldering.

Figure 3C:
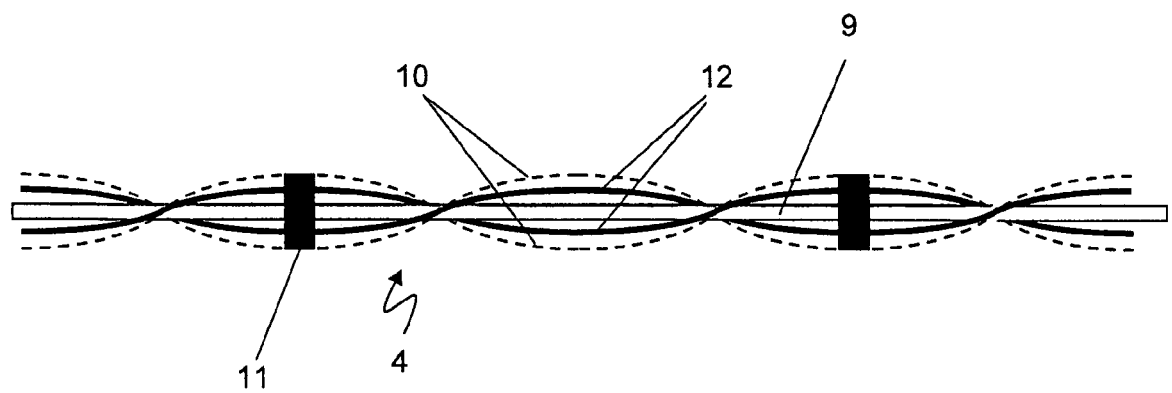
FIG. 3c shows a detailed view of a line package of an inventive MR probe head with reinforcing elements.

The RF lines 10 are preferably twisted in a defined periodic fashion between two coupling elements 11 (FIG. 3b). This is explained in more detail below.

the cooling line 9 or the line package 4 is additionally reinforced by suitable reinforcing elements 12, e.g. steel wires (FIG. 3c).

the lines are thermally insulated from the outer jacket which is at room temperature, through vacuum insulation 13b (FIG. 3a) and super insulation, and optionally supported by spacers (not shown).

Figure 4B:
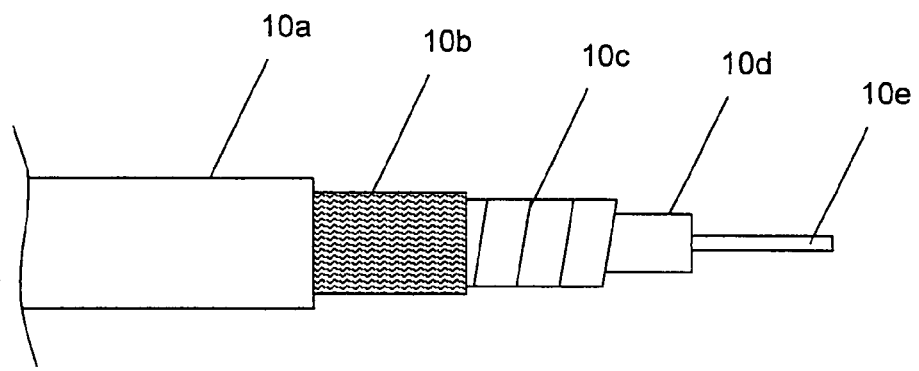
FIG. 4b shows the construction of an RF cable for an RF line of an inventive MR probe head.
Figure 4A:
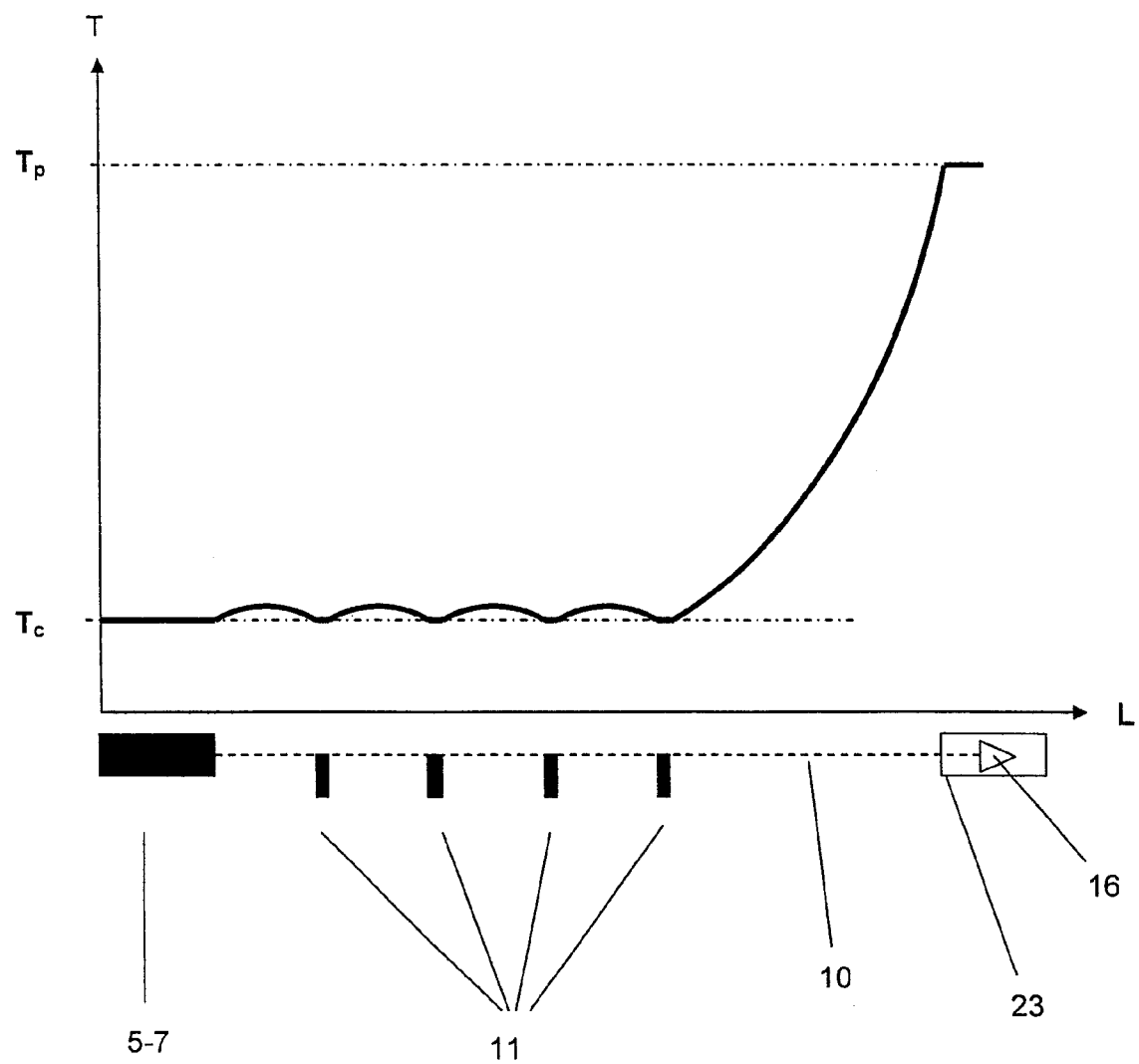
FIG. 4a shows a temperature dependence of an RF line of an inventive MR probe head in dependence on its running length.
Figure 5:
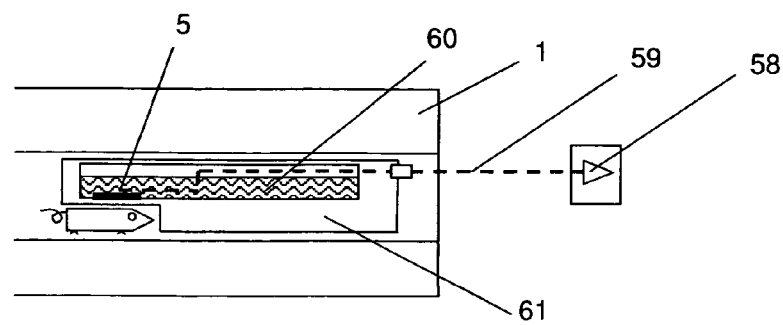
FIG. 5 shows a conventional MR probe head with LN2 cooling of the receiver coil.
Figure 6:
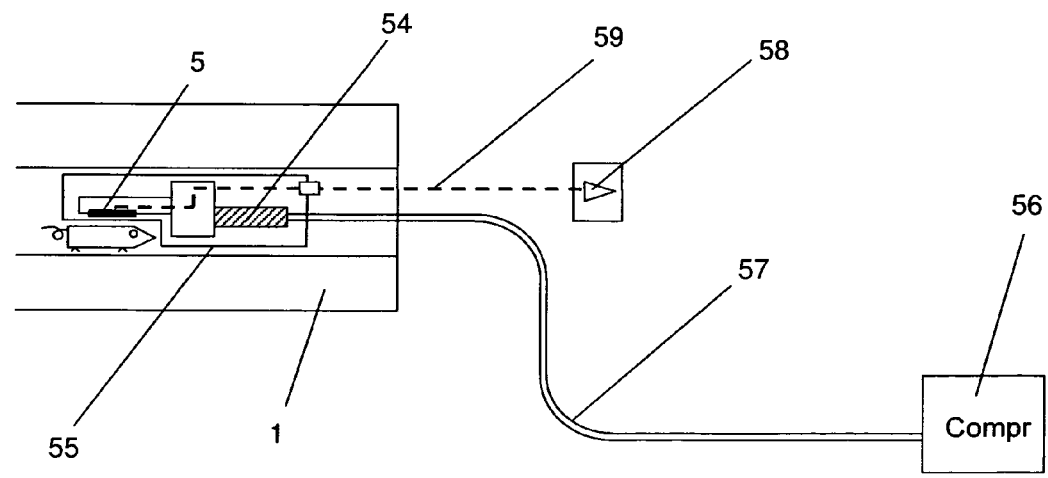
FIG. 6 shows a conventional MR probe head in a horizontal magnet with a pulse tube cooler in the room temperature bore of the magnet for cooling a receiver coil.

The temperature dependence of one of the RF lines 10 is shown in FIG. 4a.

The temperature of the flexible RF lines 10 is kept very low along a predetermined length which corresponds in practice to the overall length of the connecting line 8, starting from the receiver coils 5, and optionally further thermal elements (heat-conducting connection 6, heat exchanger 7) (shown in the illustration as a black box on the left). This temperature corresponds approximately to the temperature $T_c$ of the receiver coils 5, but may also be slightly less, since the flexible RF line 10 is directly cooled by the cooling line(s) 9a, 9b (FIG. 3a). The feed 9a thereby always has a lower temperature than the receiver coil 5. Cooling of the RF line 10 is maintained through more or less regular thermal connection of the RF line 10 through the coupling elements 11 along the entire length between the coupling elements. Thereby, the RF line 10 nevertheless remains highly flexible. The separations between the coupling elements 11 can be easily dimensioned such that even the temperature between the coupling elements 11 also rises only on the order of magnitude of 1K, due to the sufficient thermal longitudinal conductivity of the RF line 10 and the minimum heat input from the outside when good vacuum insulation is used. The temperature dependence of the RF lines 10 between the coupling elements 11 is approximately a square function. For this reason, the maximum excess temperature can be easily reduced when required by arranging the coupling elements 11 more tightly.

The thermal connections to the coupling elements 11 terminate along a precisely selected section just before the preamplifier 16 or its thermal stage 23 (on the right in FIG. 4a). This produces a continuous transition between the temperature of the cooling line 9a, 9b and the preamplifier temperature $T_p$. The exact dependence is given by the heat conductivity of the RF line 10 as a function of the temperature and by the external heat input, and is only schematically shown in FIG. 4a. The length of path of this transition is dimensioned such that the total additional RF loss or the noise input of the warmer part of the RF line 10 becomes as low as possible without forming an excessive heat bridge between the cooling lines 9a and 9b and the preamplifier 16, since the shorter this transition, the lower the total negative loss effects, but the higher the thermal conductivity along the transition length. An excessive heat conductivity would unnecessarily increase the temperature of the first cooling circuit which comprises i.a. the cooling lines 9a, 9b, and thereby finally also the temperature of the receiver coil(s) 5. The length of the transition path can be optimally selected such that the overall performance is only minimally influenced. This optimization is not critical, and substantially independent of the length L of the RF line, since the temperature of the cooled conducting part located between the coupling elements 11 is always minimum, and only a short part of the RF line 10 forms the temperature transition. This thermal configuration yields extremely low RF losses even when the connecting lines 8 are long, which is accompanied by only minimum noise increase, thereby hardly influencing the efficiency of the system.

A particular embodiment which is described below is used as the actual RF line 10. The RF line 10 is thereby realized in the form of a coaxial cable. Common coaxial conductors are either completely rigid or semi-rigid. These two embodiments are absolutely unsuitable for the inventive MR probe head, since they would already break after a few bending cycles due to the required bending radii. On the other hand, there are coaxial cables with a wire braiding as outer jacket. These are sufficiently flexible but are, in principle, disadvantageous, since their shielding effect is not very good, typically only approximately 40 dB due to the holes in the shielding braiding. This is unfavorable, since when several cables extend closely next to each other, crosstalk impairs the mutual decoupling of the channels, in particular, in an array system.

One advantageous component of the inventive configuration is therefore the use of a particular coaxial cable which has an additional inner outer jacket 10c of a spirally wound metal foil, which is surrounded by an outer conductor 10b in the form of a conventional wire braiding. Such a cable is schematically shown in FIG. 4b. When used for this purpose, such cables have the very favorable property that they are still sufficiently flexible and also have very high shielding values (>90 dB) and have a very good RF quality and therefore low loss at low temperatures. They may be provided with a PTFE jacket 10a which is sufficiently flexible and does not break, even at low temperatures. The flexibility of the jacket may additionally be increased if required by dividing it into short segments, such that the RF line can be kept highly flexible even in the cold state. This PTFE jacket 10a reliably keeps the coaxial cable together even at low temperatures. The inside of the cable is designed by a conventional insulator 10d, in particular of PTFE. The inner conductor 10e is either a strand or an individual conductor.

A cable of this type is sufficiently flexible for the critical outer layers 10a-10c, and the inner components 10d, 10e are not critical in view of the intended bending strain due to the small diameters. In this fashion, the RF line 10 has all properties required for the intended application: It is flexible, has very low damping values at low temperatures and good crosstalk damping, and is also sufficiently resistant to bending fatigue.

A further essential feature of the inventive connecting line is that the RF lines 10 are not guided parallel to their associated cooling lines 9 but are twisted relative to the cooling line 9 between two coupling elements 11 through approximately 360 degrees or an integer multiple thereof. The cooling and RF lines form a line package 4. This is shown in FIG. 3b. As a result thereof, when the connecting line 8 is bent, the overall length of the section of the RF lines 10 between two coupling elements 11 and between them and the cooling line 9 remains the same, since the length differences of the parts facing towards the bending center and the parts located on the outside are, to first order, balanced during twisting. In consequence thereof, the RF lines 10 do not bulge or bend when the connecting line 8 is bent. Without this measure, the service life of the RF lines 10 would be unpredictably reduced through repeated local bending, and the cooling line 9 would also be exposed to unnecessary local forces.

The inventive connecting line advantageously comprises one further feature: Two or more defined rigid or elastic reinforcing elements 12 (longitudinal elements, e.g. steel wires) can be mounted in a similar fashion about the cooling line 9, which is already the case in the RF lines 10. This is shown in FIG. 3c. These reinforcing elements 12 are dimensioned such that they are just sufficiently flexible for the intended bending radii and forces. They then form a natural guidance of the overall cold structure of the line package (consisting of the respective cooling line 9 and the RF lines 10 associated therewith) and ensure that it is not locally bent. This is important to ensure that there are only steady, uniform bending radii of the cold elements at any location. This again substantially reduces maximum local stresses that could cause premature fatigue fractures.

The line packages 4 are thermally insulated and mechanically supported against the outer jacket. Moreover, these line packages 4 are also advantageously twisted with each other, at least once through 360 degrees along the length of the flexible connecting line 8. The thermal insulation is realized e.g. through initial individual wrapping and then common wrapping with super insulation foil. Spacers may optionally be periodically used to support the cold parts relative to the outer jacket, advantageously starting from the hard coupling elements 11.

The above-described features produce a flexible connecting line 8 with excellent properties. For testing the flexibility in the cold state, 1000 bending cycles were carried out at a temperature of approximately 20 K and a bending radius of 30 cm. No failure was observed.

A connecting line of this type permits implementation of an MR system with a cooled preamplifier which is connected to a cold detecting device through a flexible, cold line. A cold NMR/MRI measuring head with maximum performance can be inserted into the magnet in a simple manner like a conventional room temperature measuring coil using the above-described device.

Figure 9A:
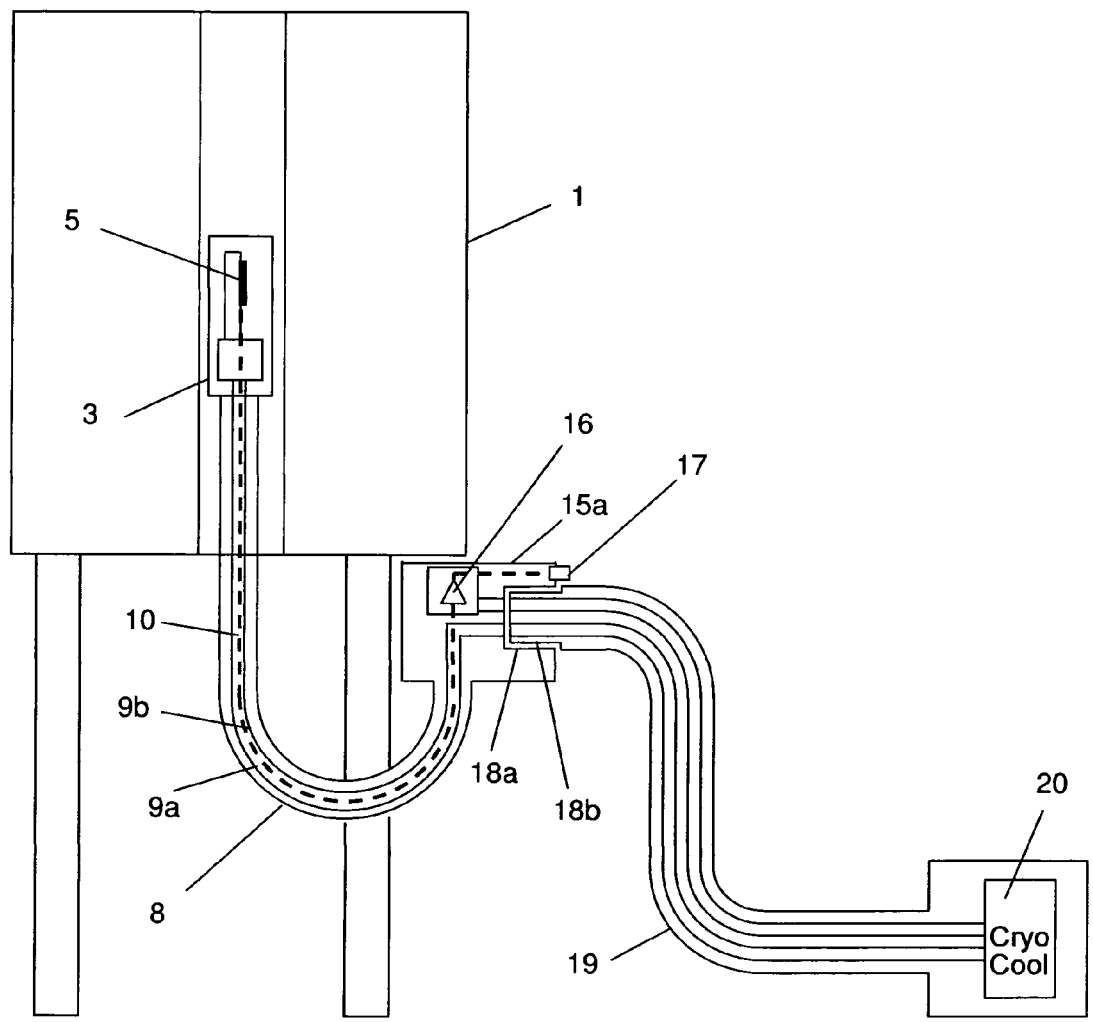
FIG. 9a shows an inventive NMR probe head with flexible connecting line in a vertical magnet for high-resolution NMR spectroscopy.
Figure 9B:
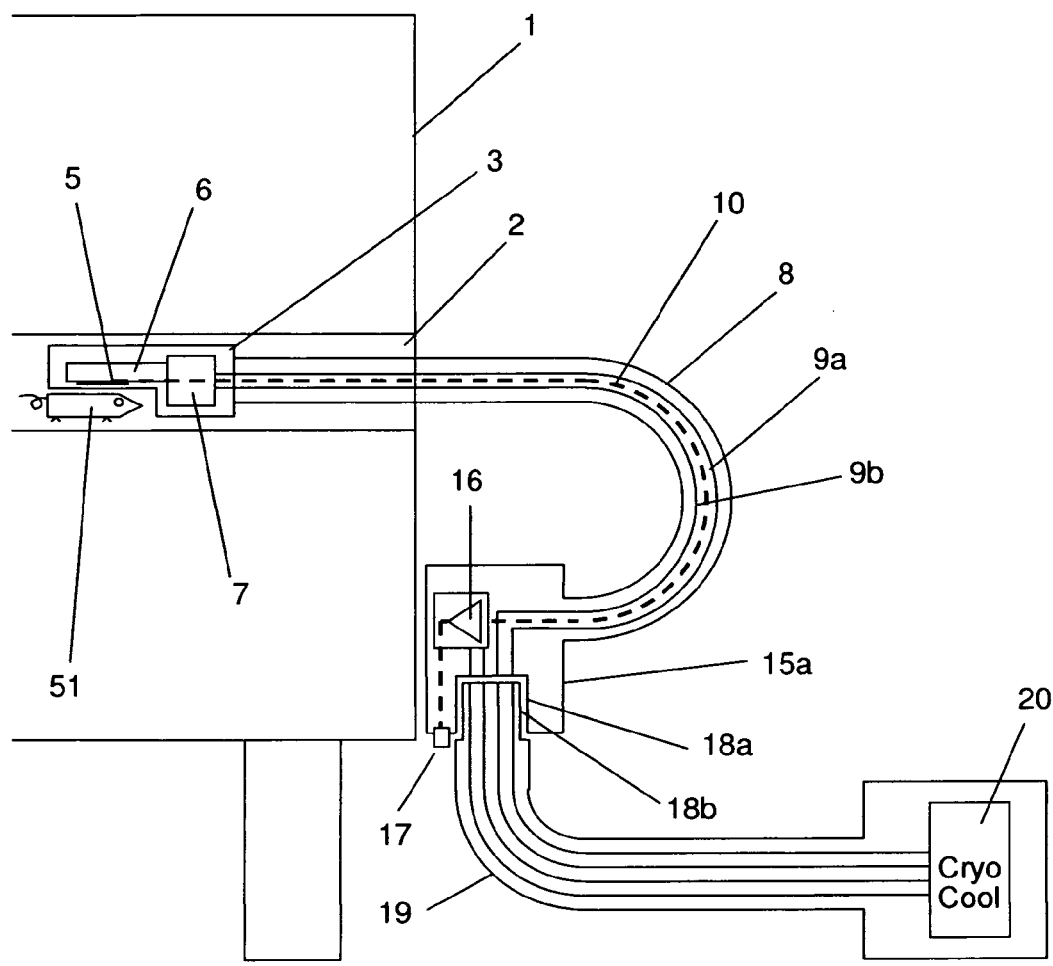
FIG. 9b shows an inventive MRI probe head with flexible connecting line in a horizontal magnet for MRI applications.

FIGS. 9a and 9b show two possible MR system configurations. FIG. 9a shows an NMR system for high-resolution NMR spectroscopy or micro imaging. FIG. 9b shows an MRI system for MR imaging.

LIST OF REFERENCE NUMERALS 1 magnet
2 room temperature bore of the magnet
3 detecting device
4 line package
5 receiver coil
6 heat conducting connection to cool the receiver coil
7 heat exchanger for cooling the receiver coil
8 flexible connecting line between the detecting device and the preamplifier
8a outer jacket of the flexible connecting line
9 flexible cooling line to cool the coil
9a flexible cooling line to cool the coil (feed)
9b flexible cooling line to cool the coil (return)
10 flexible RF line
10a outer jacket (PTFE) of the flexible RF line
10b outer conductor (braiding) of the flexible RF line
10c inner outer jacket (metal foil) of the flexible RF line
10d insulator (PTFE) of the flexible RF line
10e inner conductor of the flexible RF line
11 coupling element between the cooling line and the RF line for cooling the RF line
12 reinforcing element (steel wire)
13a vacuum in the detecting device
14 first cooling circuit
15a preamplifier housing as part of the probe head
15c rigid connecting means
16 cooled preamplifier
17 signal output at the output of the preamplifier
18a coupling part on the preamplifier side between the preamplifier housing and the cryocooler
18b coupling part on the cryocooler side between the preamplifier housing and the cryocooler
19 transfer line between the cryocooler and the probe head
20 cryocooler
21a continuing cooling line
21b continuing cooling line
21c continuing cooling line
21d continuing cooling line
22 second cooling circuit
23 thermal stage (heat sink) of the cooled preamplifier(s)
51 test object
52 rigid RF line within the probe head
54 pulse tube cold head
55 thermally insulated housing for pulse tube system
56 compressor for pulse tube cold head
57 flexible pressure line between the compressor and the pulse tube cold head
58 preamplifier at room temperature
59 RF line between the RF coil and the preamplifier (at room temperature)
60 LN2 for cooling the receiver coil
61 thermally insulated housing (foamed polystyrene)
62 wall
D1 required separation magnet/wall for rigid probe head
D2 required separation magnet/wall for flexible probe head
$T_p$ preamplifier temperature
$T_c$ temperature of receiver coil
L running length along the flexible RF line (coordinate)

LIST OF REFERENCES

[1] WO 2003/050554 A3
[2] DE 196 48 253 A1
[3] DE 199 46 371 C1
[4] "Cryogenic probe setup for routine MR imaging on small animals at 9.4 T", R. Haueisen, D. Marek, M. Sacher. F. Kong, K. Ugurbil, S. Junge, ESMRM Basel, 16 Sep. 2005
[5] U.S. Pat. No. 5,829,791
[6] U.S. Pat. No. 5,889,456.

We claim:

1. A magnetic resonance probe head, comprising:
a detecting device having at least one antenna system which is cryogenically cooled by a cooling device;
a preamplifier housing which is spatially separated from the detecting device;
a cooled preamplifier disposed in said preamplifier housing; and
a thermally insulating connecting means disposed between and connecting said detecting device to said preamplifier housing, the connecting means comprising at least one cooling line for supplying and returning a cooling fluid, and at least one RF line for transmitting electric signals, said connecting means having a mechanically flexible connecting line, mechanically flexible RF lines, and mechanically flexible cooling lines.

2. The MR probe head of claim 1, wherein the probe head is structured for at least one of magnetic resonance imaging (MRI) applications and NMR (nuclear magnetic resonance) spectroscopy.

3. The MR probe head of claim 1, wherein at least two cooling lines comprise a first cooling circuit.

4. The MR probe head of claim 1, wherein at least one RF line has an associated one single cooling line, wherein said at least one RF line and said associated cooling line constitute one line package.

5. The MR probe head of claim 4, wherein said cooling line and said at least one RF line of said one line package are thermally connected to each other via coupling elements having good thermal conductivity.

6. The MR probe head of claim 4, wherein at least one said line package contains at least one of an elastic reinforcing element and a wire having high mechanical strength.

7. The MR probe head of claim 4, wherein individual said line packages are twisted about each other.

8. The MR probe head of claim 5, wherein said at least one RF line of said line package twisted with said cooling line between two coupling elements.

9. The MR probe head of claim 1, wherein said RF line comprises at least one of a flexible coaxial cable and a cable having polytetrafluoroethylene insulation, wherein an outer conductor comprises a combination of metal braiding and spirally wound metal foil having good electrical conducting properties.

10. The MR probe head of claim 1, wherein cold parts of at least one of said connecting line, said cooling lines, and said RF lines are disposed for thermal insulation in a vacuum within at least one flexible outer jacket.

11. The MR probe head of claim 3, wherein cooled preamplifier electronics are cooled by a second cooling circuit which is separate from said at least one cooling line.

12. The MR probe head of claim 11, wherein said first and said second cooling circuits are cooled by a same cooling device.

13. The MR probe head of claim 1, wherein a cooling fluid is helium.

14. The MR probe head of claim 1, wherein the cooling device is a Gifford-McMahon cooler.

15. The MR probe head of claim 1, wherein the cooling device is a pulse tube cooler.

16. The MR probe head of claim 1, wherein said antenna system is operated at a lower temperature than said preamplifier.

17. The MR probe head of claim 16, wherein said antenna system is operated at a temperature in a range between 4 and 40 K and said preamplifier is operated at a temperature in a range between 40 and 100 K.

18. The MR probe head of claim 5, wherein a separation between said preamplifier and a last coupling element on a side of said preamplifier is larger than an average separation between two said coupling elements.

19. The MR probe head of claim 1, wherein a mass of said detecting device is less than 5 kg.

20. The MR probe head of claim 2, wherein said preamplifier comprises several parallel preamplifier channels.

21. The MR probe head of claim 20, wherein said preamplifier comprises several parallel channels for a same nucleus to be examined or for 1H.

22. The MR probe head of claim 21, wherein said preamplifier comprises channels for amplifying the signals of at least one of 31P, 13C, 23Na, 19F, 17O, 129Xe 2H nuclei.

23. An MR system having the MR probe head of claim 1.

24. The MR system of claim 23, wherein the system is at least one of an MRI and an NMR system.

* * * * *